US010222839B1

(12) United States Patent
Lin

(10) Patent No.: US 10,222,839 B1
(45) Date of Patent: Mar. 5, 2019

(54) ELECTRONIC COMPONENT PROTECTION DEVICE, SMART TEXTILE EQUIPPED WITH ELECTRONIC COMPONENT PROTECTION DEVICE AND MANUFACTURING METHOD OF ELECTRONIC COMPONENT MODULE

(71) Applicant: INTELLIGENCE TEXTILE TECHNOLOGY CO., LTD., Taipei (TW)

(72) Inventor: Chen-Hsiang Lin, Taipei (TW)

(73) Assignee: INTELLIGENCE TEXTILE TECHNOLOGY CO., LTD. (TW)

( * ) Notice: Subject to any disclaimer, the term of this patent is extended or adjusted under 35 U.S.C. 154(b) by 0 days.

(21) Appl. No.: 15/980,968

(22) Filed: May 16, 2018

(30) Foreign Application Priority Data

Feb. 6, 2018 (TW) .............................. 107104146 A

(51) Int. Cl.
*G06F 1/16* (2006.01)
*H05K 5/03* (2006.01)
*H05K 7/14* (2006.01)

(52) U.S. Cl.
CPC ............ *G06F 1/1656* (2013.01); *G06F 1/163* (2013.01); *H05K 5/03* (2013.01); *H05K 7/1427* (2013.01)

(58) Field of Classification Search
CPC combination set(s) only.
See application file for complete search history.

(56) References Cited

U.S. PATENT DOCUMENTS

| 6,137,675 | A | * | 10/2000 | Perkins | G06F 1/163 |
| | | | | | 128/876 |
| 6,243,870 | B1 | * | 6/2001 | Graber | G06F 1/163 |
| | | | | | 2/69 |
| 6,324,053 | B1 | * | 11/2001 | Kamijo | G06F 1/163 |
| | | | | | 2/264 |
| 6,507,486 | B2 | * | 1/2003 | Peterson, III | G06F 1/163 |
| | | | | | 361/679.03 |
| 6,522,531 | B1 | * | 2/2003 | Quintana | G06F 1/163 |
| | | | | | 342/357.52 |
| 8,861,220 | B2 | * | 10/2014 | Loher | H05K 1/0283 |
| | | | | | 174/254 |
| 9,078,478 | B2 | * | 7/2015 | Ross, Jr. | A41D 27/10 |

(Continued)

FOREIGN PATENT DOCUMENTS

TW    M425536 U    11/2011
TW    I589269 B     4/2016

*Primary Examiner* — Lisa Lea-Edmonds
(74) *Attorney, Agent, or Firm* — Schmeiser, Olsen & Watts, LLP

(57) ABSTRACT

An electronic component protection device includes a box and a cover. The box includes an accommodating groove and only one outlet wire groove disposed on a side wall of the accommodating groove. The accommodating groove accommodates an electronic component. At least one conductive wire of the electronic component is disposed in the outlet wire groove. A first cover portion of the cover covers an opening of the accommodating groove. A second cover portion of the cover covers the outlet wire groove. The second cover portion is coupled to the first cover portion and has a protrusion. When the second cover portion covers the outlet wire groove, the protrusion is coupled to the outlet wire groove to form an outlet wire accommodating space for accommodating the at least one conductive wire.

16 Claims, 4 Drawing Sheets

(56) References Cited

U.S. PATENT DOCUMENTS

| | | | |
|---|---|---|---|
| 9,521,788 B2* | 12/2016 | McConnell | A61N 1/16 |
| 9,933,818 B2* | 4/2018 | Vacas Jacques | A41B 1/08 |
| 2011/0007468 A1* | 1/2011 | Burton | G04F 10/00 |
| | | | 361/679.03 |
| 2012/0114270 A1* | 5/2012 | Roberts | A45C 11/00 |
| | | | 383/109 |
| 2012/0185999 A1* | 7/2012 | Raviv | A41D 27/205 |
| | | | 2/247 |
| 2012/0186000 A1* | 7/2012 | Raviv | A41B 1/00 |
| | | | 2/247 |
| 2015/0181692 A1* | 6/2015 | Jezewski | H05K 1/0393 |
| | | | 361/679.03 |
| 2017/0017265 A1* | 1/2017 | Vacas Jacques | A61B 5/6805 |
| 2017/0086510 A1* | 3/2017 | Aleksov | A41D 1/002 |

\* cited by examiner

ELECTRONIC COMPONENT PROTECTION DEVICE, SMART TEXTILE EQUIPPED WITH ELECTRONIC COMPONENT PROTECTION DEVICE AND MANUFACTURING METHOD OF ELECTRONIC COMPONENT MODULE

CROSS-REFERENCE TO RELATED APPLICATION

This non-provisional application claims priority under 35 U.S.C. § 119(a) on Patent Application No(s). 107104146 filed in Taiwan, R.O.C. on Feb. 6, 2018, the entire contents of which are hereby incorporated by reference.

TECHNICAL FIELD

The present disclosure relates to electronic component protection devices, and in particular, to a washable electronic component protection device, a smart textile equipped with the electronic component protection device, and a manufacturing method of an electronic component module.

RELATED ART

In recent years, wearable technologies related to smartwatches, technical bracelets and other related products, for example, are becoming more diversified. Among them, smart textiles are developing rapidly. However, the existing smart textile related technology still has some shortcomings.

For example, Taiwan patent no. M425536 "Wireless smart clothing system" discloses a wireless smart clothing system comprising a battery module and an actuation module, and the battery module and the actuation module have to be removed before the smart clothing is washed.

In addition, Taiwan patent no. 1589269 "Electrocardiography scanner module, multi-contact connector thereof, electrocardiography scanner thereof and smart clothing using the same" discloses a multi-contact connector configured on the smart clothing having several conductive wires, the multi-contact connector comprises several first conductive portions, and each first conductive portion is electrically connected to a corresponding conductive wire. However, the more electrical connection points the smart clothing has, the higher is the probability that the multi-contact connector will be damaged due to the pulling of the smart clothing (for example, pulling during washing).

Therefore, how to solve the above shortcomings in order to enhance user experience in the smart textiles is obviously one of the most important topics.

SUMMARY

In order to solve the above shortcomings of the prior art, the present disclosure provides a washable electronic component protection device, a smart textile equipped with the electronic component protection device, and a method for manufacturing an electronic component module.

According to an embodiment of the present disclosure, the present disclosure discloses an electronic component protection device comprising a box and a cover. The box comprises an accommodating groove and only one outlet wire groove. The accommodating groove accommodates an electronic component. The outlet wire groove is disposed on a side wall of the accommodating groove for accommodating at least one conductive wire of the electronic component, wherein the at least one conductive wire is electrically connected to at least one textile conductive wire of a smart textile. The cover comprises a first cover portion and a second cover portion. The first cover portion covers an opening of the accommodating groove. The second cover portion is connected to the first cover portion and protrudes from the first cover portion. The second cover portion also has a protrusion for covering the outlet wire groove. When the second cover portion covers the outlet wire groove, the protrusion is coupled to the outlet wire groove to form an outlet wire accommodating space for accommodating the at least one conductive wire of the electronic component.

According to an embodiment of the present disclosure, the present disclosure discloses a smart textile comprises the aforementioned electronic component protection device, the at least one textile conductive wire and the electronic component.

According to an embodiment of the present disclosure, the present disclosure discloses a manufacturing method of an electronic component module. The steps of the method are as follows: accommodating an electronic component in an accommodating groove of a box; accommodating at least one conductive wire of the electronic component in only one outlet wire groove of the box; smearing waterproof glue on the box and a cover; and covering an opening of the box with a first cover portion of the cover and covering the outlet wire groove with a second cover portion of the cover.

According to an embodiment of the present disclosure, materials for the box and the cover are ones selected from rubber and silicone.

These and other objectives of the present invention will no doubt become obvious to those of ordinary skill in the art after reading the following detailed description of the preferred embodiment that is illustrated by accompanying drawings.

DETAILED DESCRIPTION OF THE PREFERRED EMBODIMENTS

To make it easier for the examiner to understand the objects, characteristics and effects of this present disclosure, embodiments together with the accompanying drawings for the detailed description of the present disclosure are provided.

Please refer to FIG. 1A, FIG. 1B, FIG. 1C, FIG. 1D and FIG. 1E, an electronic component protection device 1000 of an embodiment of the present disclosure comprises a box 100 and a cover 200, wherein an electronic component 300 is accommodated in the electronic component protection device 1000 to form an electronic component module, and materials for the box 100 and the cover 200 are ones selected from rubber, silicone and other material that is waterproof and resistant to high temperatures.

Figure 1A:
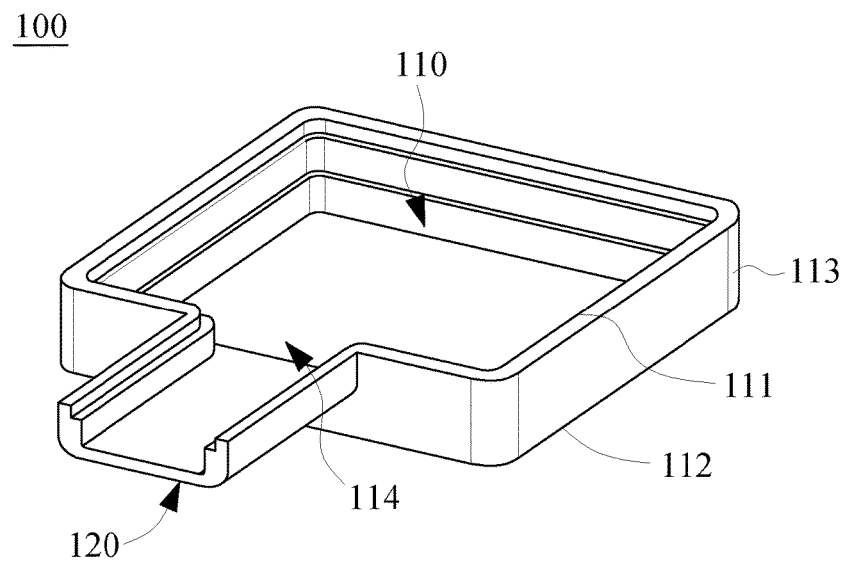
FIG. 1A is a diagram illustrating a box of an embodiment of the present disclosure.

Referring to FIG. 1A, the box 100 comprises an accommodating groove 110 and only one outlet wire groove 120. The accommodating groove 110 has an opening 111, a bottom 112 and a side wall 113. The side wall 113 is disposed between the opening 111 and the bottom 112 to form the accommodating groove 110. The outlet wire groove 120 is disposed on the side wall 113 of the accommodating groove 110 and closing to one side of the opening 111. The outlet wire groove 120 is coupled to an outlet wire groove opening 114 of the side wall 113 and protrudes from the accommodating groove 110.

Figure 1B:
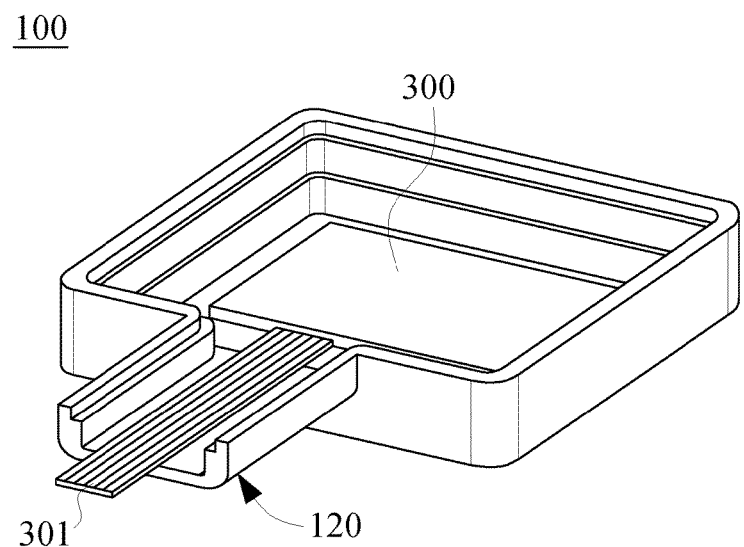
FIG. 1B is a diagram illustrating an electronic component accommodated in the box of an embodiment of the present disclosure.

As shown in FIG. 1B, the electronic component 300 is accommodated in the accommodating groove 110 and electrically connected to one end of at least one conductive wire 301. When sorted, the at least one conductive wire 301 can be disposed in the outlet wire groove 120 through the outlet wire groove opening 114, and the at least one conductive wire 301 extends to the outside of the electronic component protection device 1000. In an embodiment of the present disclosure, the electronic component 300 is one selected from a chip module, a printed circuit board and a battery element, and the present disclosure is not limited thereto.

Therefore, another end of the at least one conductive wire 301 is electrically connected to at least one textile conductive wire of the outside of the electronic component protection device 1000 through the outlet wire groove 120. The at least one textile conductive wire is conductive fabric, for example, nano-silver wire or conductive yarn, but the type of the textile conductive wire is not intending to limit the present disclosure.

Figure 1C:
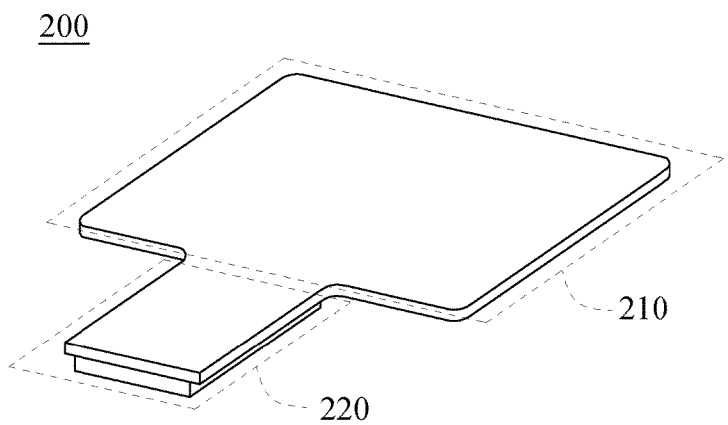
FIG. 1C is a diagram illustrating a front side of a cover of an embodiment of the present disclosure.
Figure 1D:
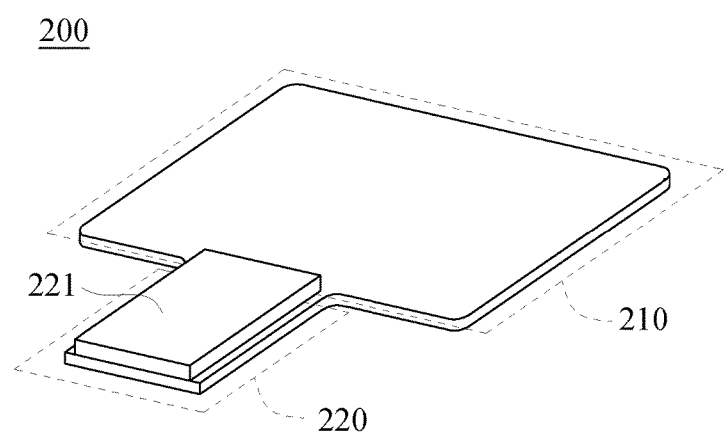
FIG. 1D is a diagram illustrating a back side of a cover of an embodiment of the present disclosure.

Please refer to FIG. 1C and FIG. 1D, FIG. 1C is a diagram of a front side of the cover 200, and FIG. 1D is a diagram of a back side of the cover 200. The cover 200 comprises a first cover portion 210 and a second cover portion 220. The first cover portion 210 covers the opening 111 of the box 100. The second cover portion 220 covers the outlet wire groove 120. The second cover portion 220 is coupled to a part of the first cover portion 210 and protrudes from the first cover portion 210. A protrusion 221 is provided on the back side of the second cover portion 220 of the cover 200.

Figure 1E:
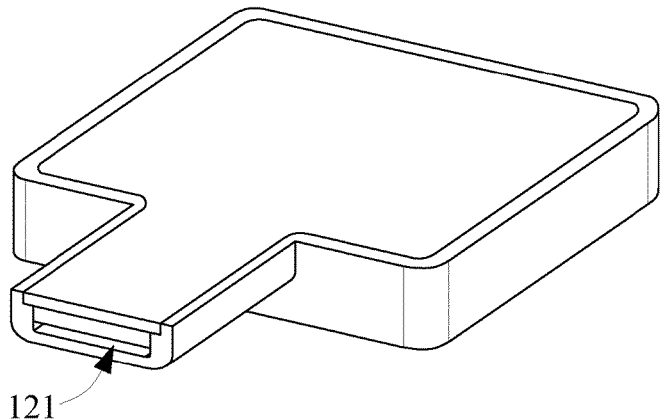
FIG. 1E is a diagram illustrating the cover covering the box of an embodiment of the present disclosure.

As shown in FIG. 1E, when the cover 200 covers the box 100, the back side of the first cover portion 210 faces and covers the opening 111, and the back side of the second cover portion 220 faces and covers the outlet wire groove 120. Simultaneously, the protrusion 221 is coupled to the outlet wire groove 120 to form an outlet wire accommodating space 121. Therefore, the at least one conductive wire 301 disposed in the outlet wire groove 120 can extend to the outside of the electronic component protection device 1000 through the outlet wire accommodating space 121.

In an embodiment of the present disclosure, when the electronic component 300 is accommodated in the accommodating groove 110 and the at least one conductive wire 301 is sorted and accommodated in the outlet wire groove 120, the box 100 and cover 200 can be smeared with waterproof glue. Then, the cover 200 covers the box 100 and sticks to the box 100 by the waterproof glue. The waterproof glue fills a vacant space between the outlet wire groove 120 and the conductive wire 301.

The accommodating groove 110 and the outlet wire groove 120 are polygonal, round or oval. The cover 200 corresponds in shape to the box 100. As shown in FIG. 1E, in an embodiment of the present disclosure, the accommodating groove 110 and the outlet wire groove 120 are quadrilateral, whereas the first cover portion 210 and the second cover portion 220 are also quadrilateral so as to correspond in shape to the accommodating groove 110 and the outlet wire groove 120. In an embodiment of the present disclosure, lengths of a first side and a second side (adjacent to the first side) of the accommodating groove are the same, for example, the lengths are 3 cm, and a length of a long side of the outlet wire groove 120 is 1.5 cm and a length of a short side of the outlet wire groove 120 is 1 cm. However, the aforementioned lengths of the first side, the second side, the long side and the short side are merely exemplary, and the present disclosure is not limited thereto.

Figure 2:
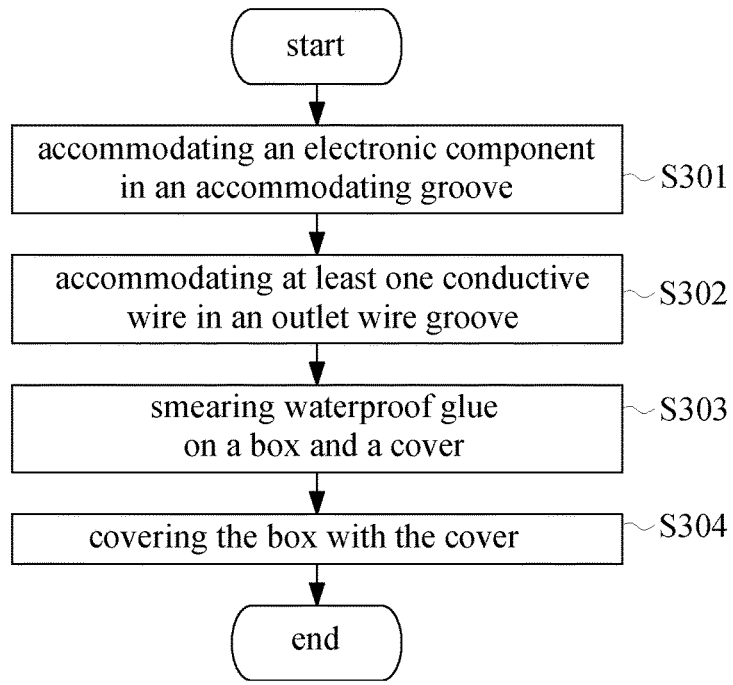
FIG. 2 is a diagram illustrating a manufacturing method of an electronic component module of an embodiment of the present disclosure.

Please refer to FIG. 2, FIG. 2 is a diagram of an embodiment of a manufacturing method of the above electronic component module, and the method comprises the following steps. At step S301, the electronic component 300 is accommodated in the accommodating groove 110 of the box 100. At step 302, the at least one conductive wire 301 of the electronic component 300 is sorted and accommodated in the outlet wire groove 120 of the box through the outlet wire groove opening 114. At step S303, waterproof glue is smeared on the box 100 and the cover 200. At step 304, an opening 111 of the box 100 is covered with the first cover portion 210 of the cover 200, the outlet wire groove 120 is covered with the second cover portion 220 of the cover 200, and thus the cover 200 sticks to the box 100 by the waterproof glue. After step S304 is executed, the electronic component protection device 1000 is formed.

Figure 3:
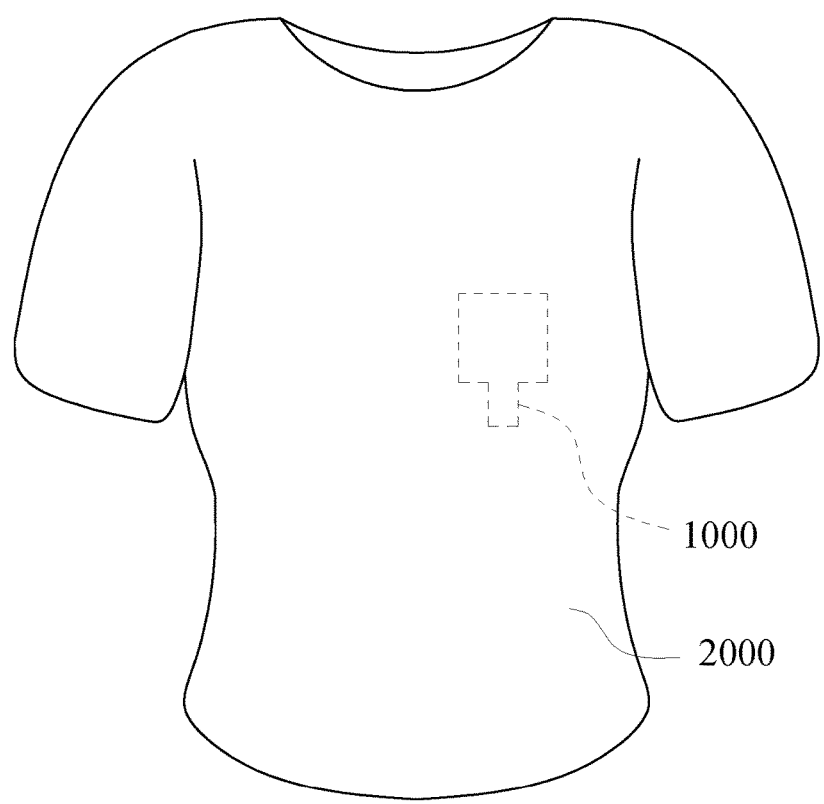
FIG. 3 is a diagram illustrating the electronic component module used in the smart textile of an embodiment of the present disclosure.

Please refer to FIG. 3, and FIG. 3 is a diagram of an embodiment of the electronic component protection device 1000 used in the smart textile 2000 of the present disclosure. In the embodiment, the smart textile 2000 is cloth waved by at least one textile conductive wire and cloth fabrics. The electronic component 300 is a smart textile control chip, but the present disclosure is not limited thereto. The electronic component 300 of the electronic component protection device 1000 is electrically coupled to the at least one textile conductive wire through the at least one conductive wire 310, and thus the electronic component protection device 1000 can transmit/receive electrical signals to/from the smart textile 2000. For example, when a user wears the smart textile 2000 comprising physiological sensors, the electronic component 300 of the electronic component protection device 1000 receives signals of the user's heart rate, respiratory rate and other physiological information sensed by the physiological sensors.

In summary, the materials for the electronic component protection device 1000 of the present disclosure are ones selected form rubber, silicone or other washable and high temperature resistance material, and thus the smart textile 2000 with the electronic component protection device 1000 of the present disclosure is washable without removing the electronic component protection device 1000. In addition, the at least one conductive wire 301 of the electronic components 300 is electrically connected to the at least one textile conductive wire through the only one outlet wire groove 120 of the electronic component protection device 1000. Therefore the electronic component protection device 1000 has a smaller size, the probability of damaging the conductive wire 301 is reduced, and maintenance of the electronic component protection device 1000 is easier to carry out.

While the present disclosure has been described by means of specific embodiments, numerous modifications and variations could be made thereto by those skilled in the art without departing from the scope and spirit of the present disclosure set forth in the claims.

What is claimed is:

1. An electronic component protection device, comprising:
   a box, comprising:
      an accommodating groove, for accommodating an electronic component; and
      only one outlet wire groove, disposed on a side wall of the accommodating groove for accommodating at least one conductive wire of the electronic component,
      wherein the at least one conductive wire is electrically connected to at least one textile conductive wire of a smart textile; and
   a cover, comprising:
      a first cover portion, covering an opening of the accommodating groove; and
      a second cover portion, coupled to the first cover portion and protruding from the first cover portion, provided with a protrusion for covering the outlet wire groove,
      wherein, when the second cover portion covers the outlet wire groove, the protrusion is coupled to the outlet wire groove to form an outlet wire accommodating space for accommodating the at least one conductive wire of the electronic component.

2. The electronic component protection device according to claim 1, wherein materials for the box and the cover are ones selected from rubber and silicone.

3. The electronic component protection device according to claim 1, wherein the electronic component is one selected from a chip module, a printed circuit board and a battery element.

4. The electronic component protection device according to claim 1, wherein after the electronic component is accommodated in the accommodating groove and the at least one conductive wire is accommodated in the outlet wire groove, the cover covers the box and is sticking to the box by waterproof glue, wherein the waterproof glue fills a vacant space between the outlet wire groove and the conductive wire.

5. The electronic component protection device according to claim 1, wherein lengths of a first side and a second side of the accommodating groove are 3 cm, a length of a long side of the outlet wire groove is 1.5 cm, and a length of a short side of the outlet wire groove is 1 cm, wherein the first side of the accommodating groove is adjacent to the second side of the accommodating groove.

6. A smart textile, comprising:
   an electronic component protection device;
   at least one textile conductive wire; and
   an electronic component,
   wherein the electronic component protection device comprising:
      a box, comprising:
         an accommodating groove, for accommodating the electronic component; and
         only one outlet wire groove, disposed on a side wall of the accommodating groove for accommodating at least one conductive wire of the electronic component,
         wherein the at least one conductive wire is electrically connected to the at least one textile conductive wire; and
      a cover, comprising:
         a first cover portion, covering an opening of the accommodating groove; and
         a second cover portion, coupled to the first cover portion and protruding from the first cover portion, provided with a protrusion for covering the outlet wire groove,
         wherein, when the second cover portion covers the outlet wire groove, the protrusion is coupled to the outlet wire groove to form an outlet wire accommodating space for accommodating the at least one conductive wire.

7. The smart textile according to claim 6, wherein materials for the box and the cover are ones selected from rubber and silicone.

8. The smart textile according to claim 6, wherein the electronic component is one selected from a chip module, a printed circuit board and a battery element.

9. The smart textile according to claim 6, wherein after the electronic component is accommodated in the accommodating groove and the at least one conductive wire is accommodated in the outlet wire groove, the cover covers the box and is sticking to the box by waterproof glue, wherein the waterproof glue fills a vacant space between the outlet wire groove and the conductive wire.

10. The smart textile according to claim 6, wherein lengths of a first side and a second side of the accommodating groove are 3 cm, a length of a long side of the outlet wire groove is 1.5 cm, and a length of a short side of the outlet wire groove is 1 cm, wherein the first side of the accommodating groove is adjacent to the second side of the accommodating groove.

11. A manufacturing method of an electronic component module, comprising:
    accommodating an electronic component in an accommodating groove of a box;
    accommodating at least one conductive wire in only one outlet wire groove of the box;
    smearing waterproof glue on the box and a cover; and
    covering an opening of the box with a first cover portion of the cover and covering the outlet wire groove with a second cover portion of the cover.

12. The manufacturing method of an electronic component module according to claim 11, wherein the outlet wire groove is disposed on a side wall of the accommodating groove.

13. The manufacturing method of an electronic component module according to claim 11, wherein the second cover portion has a protrusion, and the protrusion is coupled to the outlet wire groove to form an outlet wire accommodating space for accommodating the at least one conductive wire when the second cover portion covers the outlet wire groove.

14. The manufacturing method of an electronic component module according to claim 11, wherein materials for the box and the cover are ones selected from rubber and silicone.

15. The manufacturing method of an electronic component module according to claim 11, wherein the electronic component is one selected from a chip module, a printed circuit board and a battery element.

16. The manufacturing method of an electronic component module according to claim 11, wherein lengths of a first side and a second side of the accommodating groove are 3 cm, a length of a long side of the outlet wire groove is 1.5 cm, and a length of a short side of the outlet wire groove is 1 cm, wherein the first side of the accommodating groove is adjacent to the second side of the accommodating groove.

\* \* \* \* \*